(12) United States Patent
Akutagawa et al.

(10) Patent No.: US 11,075,631 B2
(45) Date of Patent: Jul. 27, 2021

(54) SEMICONDUCTOR RELAY MODULE AND SEMICONDUCTOR RELAY CIRCUIT

(71) Applicant: OMRON Corporation, Kyoto (JP)

(72) Inventors: Toshinobu Akutagawa, Kyoto (JP); Shigenari Okada, Kyoto (JP); Shinya Sasaki, Yasu (JP)

(73) Assignee: OMRON CORPORATION, Kyoto (JP)

( * ) Notice: Subject to any disclaimer, the term of this patent is extended or adjusted under 35 U.S.C. 154(b) by 0 days.

(21) Appl. No.: 17/067,765

(22) Filed: Oct. 12, 2020

(65) Prior Publication Data

US 2021/0135669 A1    May 6, 2021

(30) Foreign Application Priority Data

Oct. 30, 2019  (JP) .............................. JP2019-197681

(51) Int. Cl.
| | |
|---|---|
| *H01H 45/14* | (2006.01) |
| *H03K 17/687* | (2006.01) |
| *H01H 45/00* | (2006.01) |
| *H01H 50/02* | (2006.01) |
| *H01H 50/00* | (2006.01) |
| *H01H 47/00* | (2006.01) |
| *H01F 7/06* | (2006.01) |

(52) U.S. Cl.
CPC ........... *H03K 17/6874* (2013.01); *H01F 7/06* (2013.01); *H01H 45/00* (2013.01); *H01H 45/14* (2013.01); *H01H 47/00* (2013.01); *H01H 50/00* (2013.01); *H01H 50/02* (2013.01)

(58) Field of Classification Search
CPC ....... H03K 17/6874; F01L 9/21; H01H 47/22; H01H 47/02; H01H 47/00; H01H 45/00; H01H 45/02; H01H 45/14; H01H 50/00; H01H 50/02; H01H 50/04; H01F 7/06
See application file for complete search history.

(56) References Cited

U.S. PATENT DOCUMENTS

| | | |
|---|---|---|
| 5,559,466 A | 9/1996 | Okumura et al. |
| 9,515,652 B2 * | 12/2016 | Ohtani ............... H03K 17/6877 |

FOREIGN PATENT DOCUMENTS

JP    H07-46109 A    2/1995

* cited by examiner

*Primary Examiner* — Jung Kim
(74) *Attorney, Agent, or Firm* — Shinjyu Global Ip

(57) ABSTRACT

A semiconductor relay module includes first to third semiconductor relays, first to third input terminals, first to third output terminals, and a first connection line. A first input circuit of the first semiconductor relay and a second input circuit of the second semiconductor relay are connected to the first and second input terminals. The first and second input circuits are connected in series. A third input circuit of the third semiconductor relay is connected to the first or second input terminal and the third input terminal. A first output circuit of the first semiconductor relay is connected to the first output terminal and the first connection line. A second output circuit of the second semiconductor relay is connected to the second output terminal and the first connection line. A third output circuit of the third semiconductor relay is connected to the third output terminal and the first connection line.

7 Claims, 8 Drawing Sheets

SEMICONDUCTOR RELAY MODULE AND SEMICONDUCTOR RELAY CIRCUIT

CROSS-REFERENCE TO RELATED APPLICATION

This application claims priority to Japanese Patent Application No. 2019-197681, filed Oct. 30, 2019. The contents of that application are incorporated by reference herein in their entirety.

FIELD

The present disclosure relates to a semiconductor relay module and a semiconductor relay circuit.

BACKGROUND

JP-A-7-46109 discloses a semiconductor relay including two output semiconductor relays and one grounding semiconductor relay. The two output semiconductor relays are connected in series with each other. The grounding semiconductor relay is arranged between the grounding point and the connection point of the two output semiconductor relays.

In this semiconductor relay, each of the output semiconductor relays and the grounding semiconductor relay has two MOSFETs connected in anti-series. A photodiode array is connected to the MOSFET. The semiconductor relay includes a first input circuit and a second input circuit. The first input circuit has a first LED. The photodiode arrays of the two output semiconductor relays are configured to generate electromotive force by the light emission of the first LED to turn on the MOSFETs of the output semiconductor relays. The second input circuit has a second LED. The photodiode array of the grounding semiconductor relay is configured to generate an electromotive force by the light emission of the second LED to turn on the MOSFET of the grounding semiconductor relay.

SUMMARY

In the above semiconductor relay, the common first input circuit controls ON/OFF of the two output semiconductor relays. However, with such a configuration, it is not easy to secure stable operation characteristics. The first and second input circuits are connected to two input terminals, respectively. Therefore, the wiring and the like may be complicated, and the circuit board may be difficult to design.

Therefore, it is an object of the present disclosure to provide a semiconductor relay module and a semiconductor relay circuit that ensure stable operation characteristics and facilitate circuit board design.

A semiconductor relay module according to one aspect of the present disclosure includes a first semiconductor relay, a second semiconductor relay, a third semiconductor relay, a package, a first input terminal, a second input terminal, and a third input terminal, a first output terminal, a second output terminal, a third output terminal, and a first connection line. The first semiconductor relay includes a first input circuit and a first output circuit. The second semiconductor relay includes a second input circuit and a second output circuit. The third semiconductor relay includes a third input circuit and a third output circuit.

The package houses the first semiconductor relay, the second semiconductor relay, and the third semiconductor relay inside the package. The first input terminal, the second input terminal, and the third input terminal are arranged in the package. A part of the first input terminal, a part of the second input terminal, and a part of the third input terminal are exposed to the outside of the package. The first output terminal, the second output terminal, and the third output terminal are arranged in the package. A part of the first output terminal, a part of the second output terminal, and a part of the third output terminal are exposed to the outside of the package. The first connection line connects the first output circuit and the second output circuit inside the package.

The first input circuit and the second input circuit are connected to the first input terminal and the second input terminal inside the package. The second input circuit is connected in series with the first input circuit inside the package. The third input circuit is connected to the first input terminal or the second input terminal and the third input terminal inside the package. The first output circuit is connected to the first output terminal and the first connection line inside the package. The second output circuit is connected to the second output terminal and the first connection line inside the package. The third output circuit is connected to the third output terminal and the first connection line inside the package.

In a first state in which a current flows through the first input terminal and the second input terminal and a current does not flow through the third input terminal, the first output circuit and the second output circuit are configured to be turned on, the third output circuit is configured to be turned off, the first output terminal and the second output terminal are configured to be electrically connected, and the first connection line and the third output terminal are configured to be electrically disconnected. In the second state in which the current does not flow through the first input terminal and the second input terminal and the current flows through the third input terminal, the first output circuit and the second output circuit are configured to be turned off, the third output circuit is configured to be turned on, the first output terminal and the second output terminal are configured to be electrically disconnected, and the first connection line and the third output terminal are configured to be electrically connected.

DETAILED DESCRIPTION

Hereinafter, an example of the present disclosure will be described with reference to the drawings. In the following description, terms indicating a specific direction or position are used as necessary, but the use of these terms is for facilitating the understanding of the disclosure with reference to the drawings, and the meaning of these terms. However, the technical scope of the present disclosure is not limited thereto. Further, the following description is merely exemplary in nature, and is not intended to limit the present disclosure, its applications, or its uses. Furthermore, the drawings are schematic, and the ratios of the respective dimensions and the like do not necessarily match the actual ones.

Figure 1:
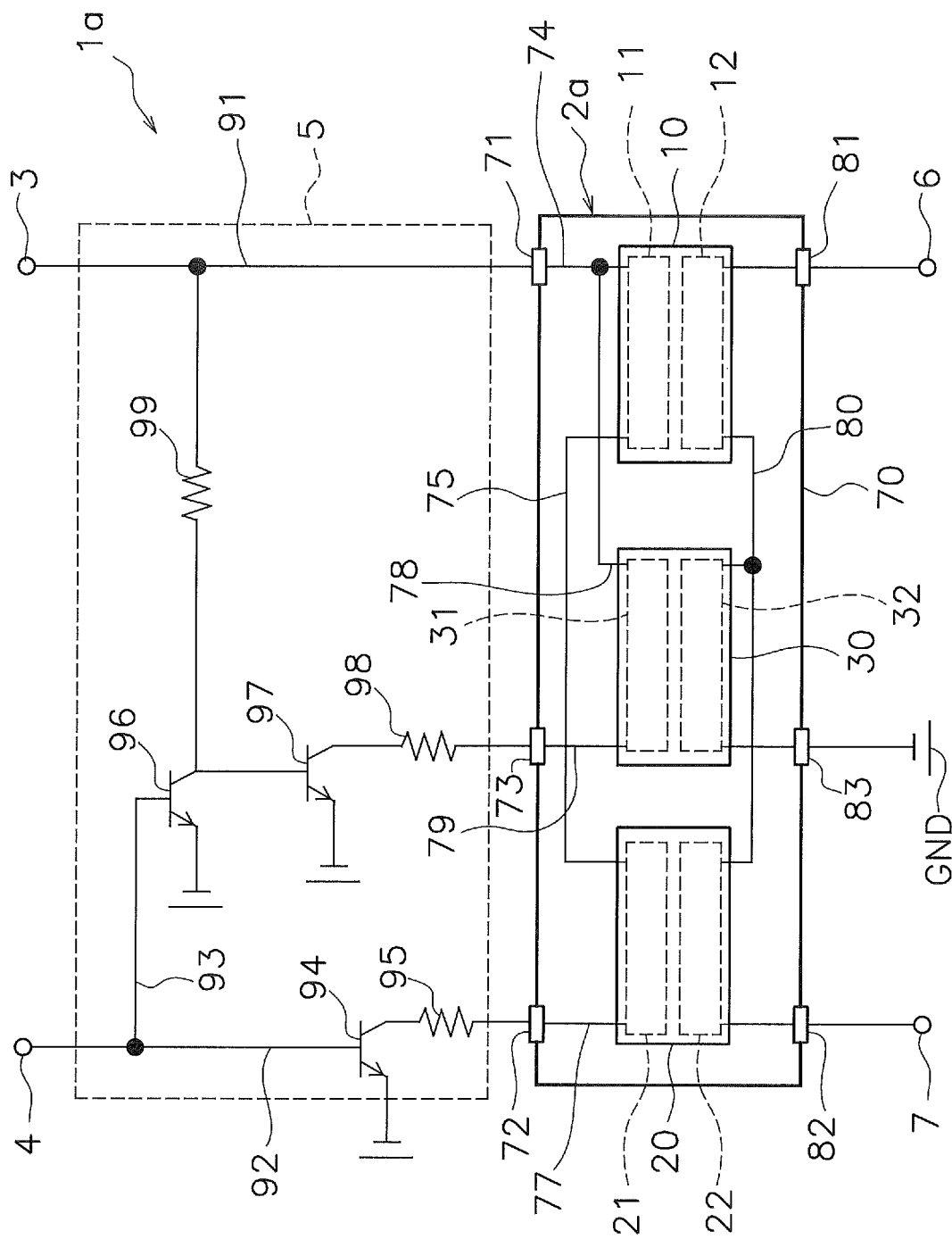
FIG. 1 is a configuration diagram showing an example of a semiconductor relay circuit according to the first embodiment.

FIG. 1 is a configuration diagram showing an example of a semiconductor relay circuit 1a according to the first embodiment of the present disclosure. As illustrated in FIG. 1, the semiconductor relay circuit 1a includes a semiconductor relay module 2a, a power supply terminal 3, a control terminal 4, and a control circuit 5. The semiconductor relay module 2a includes a first semiconductor relay 10, a second semiconductor relay 20, a third semiconductor relay 30, a package 70, a first input terminal 71, a second input terminal 72, and a third input terminal 73.

The package 70 accommodates the first semiconductor relay 10, the second semiconductor relay 20, and the third semiconductor relay 30 inside. The package 70 is formed of, for example, an insulating resin. However, the package 70 is not limited to resin and may be made of other material such as ceramic. The package 70 has, for example, a rectangular shape in a plan view. However, the package 70 is not limited to the rectangular shape and may have another shape.

The first input terminal 71, the second input terminal 72, and the third input terminal 73 are arranged in the package 70. Each of the first input terminal 71, the second input terminal 72, and the third input terminal 73 is arranged so that a part of the first input terminal, a part of the second input terminal 72, and a part of the third input terminal 73 are exposed to the outside of the package 70. The semiconductor relay module 2a further includes a first output terminal 81, a second output terminal 82, and a third output terminal 83. The first output terminal 81, the second output terminal 82, and the third output terminal 83 are arranged in the package 70. Each of the first output terminal 81, the second output terminal 82, and the third output terminal 83 is arranged so that a part of the first output terminal 81, a part of the second output terminal 82, and a part of the third output terminal 83 are exposed to the outside of the package 70.

In the semiconductor relay module 2a, inside the package 70, the first semiconductor relay 10, the second semiconductor relay 20, and the third semiconductor relay 30 are arranged side by side in the longitudinal direction of the package 70. The third semiconductor relay 30 is arranged between the first semiconductor relay 10 and the second semiconductor relay 20 in the longitudinal direction of the package 70.

The first semiconductor relay 10 includes a first input circuit 11 and a first output circuit 12. When the current is flowing through the first input circuit 11, the first output circuit 12 is in an on state. When no current is flowing through the first input circuit 11, the first output circuit 12 is in an off state. The second semiconductor relay 20 includes a second input circuit 21 and a second output circuit 22. When the current is flowing through the second input circuit 21, the second output circuit 22 is in the on state. When no current flows in the second input circuit 21, the second output circuit 22 is in the off state. The third semiconductor relay 30 includes a third input circuit 31 and a third output circuit 32. When current is flowing in the third input circuit 31, the third output circuit 32 is in the on state. When the current does not flow through the third input circuit 31, the third output circuit 32 is in the off state. Note that the "on state" means a state in which a current flows in the output circuit. The "off state" means a state in which no current flows in the output circuit.

The first input circuit 11 and the second input circuit 21 are connected to the first input terminal 71 and the second input terminal 72 inside the package 70. The first input circuit 11 is connected to the first input terminal 71 inside the package 70. The second input circuit 21 is connected to the second input terminal 72 inside the package 70. The second input circuit 21 is connected in series to the first input terminal 71 inside the package 70. The third input circuit 31 is connected to the first input terminal 71 and the third input terminal 73 inside the package 70.

Specifically, the first input circuit 11 is connected to the first input terminal 71 via the connection line 74. The first input circuit 11 is connected in series to the second input circuit 21 via the connection line 75. The second input circuit 21 is connected to the second input terminal 72 via the connection line 77. The third input circuit 31 is connected to the first input terminal 71 via the connection line 78. The third input circuit 31 is connected to the third input terminal 73 via the connection line 79. The connection lines 74, 75, 77, 78, and 79 are arranged inside the package 70.

The first output circuit 12 is connected to the first output terminal 81 and the first connection line 80 inside the package 70. The second output circuit 22 is connected to the second output terminal 82 and the first connection line 80 inside the package 70. The first output circuit 12 and the second output circuit 22 are connected in series inside the package 70 via the first connection line 80. The third output circuit 32 is connected to the third output terminal 83 and the first connection line 80 inside the package 70. The first connection line 80 is arranged inside the package 70.

Figure 2:
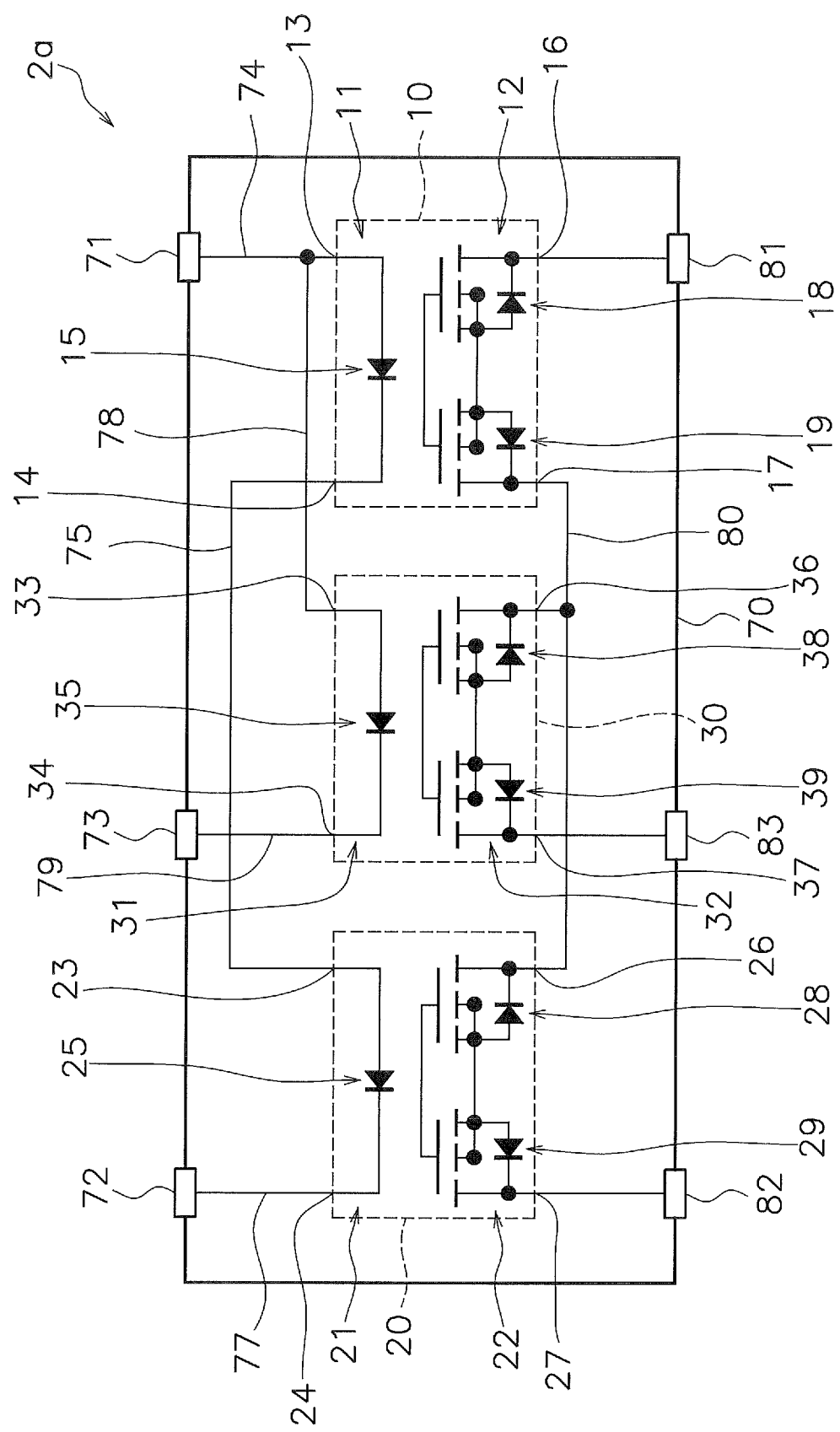
FIG. 2 is a configuration diagram showing an example of a semiconductor relay module according to the first embodiment.

FIG. 2 is a configuration diagram showing an example of the semiconductor relay module 2a. As illustrated in FIG. 2, the first input circuit 11 of the first semiconductor relay 10 includes a first input section 13, a second input section 14, and a light emitting element 15. The first input section 13 is connected to the first input terminal 71. The light emitting element 15 is connected to the first input section 13 and the second input section 14. The light emitting element 15 emits light when a current flows through the first input circuit 11.

The second input circuit 21 of the second semiconductor relay 20 includes a first input section 23, a second input section 24, and a light emitting element 25. The first input section 23 is connected in series to the second input section 14 of the first input circuit 11. The second input section 24 is connected to the second input terminal 72. The light emitting element 25 is connected to the first input section 23 and the second input section 24. The light emitting element 25 emits light when a current flows through the second input circuit 21.

The third input circuit 31 of the third semiconductor relay 30 includes a first input section 33, a second input section 34, and a light emitting element 35. The first input section 33 is connected to the first input terminal 71. The second input section 34 is connected to the third input terminal 73. The light emitting element 35 is connected to the first input section 33 and the second input section 34. The light emitting element 35 emits light when a current flows through the third input circuit 31.

The first output circuit 12 of the first semiconductor relay 10 includes a first output section 16, a second output section 17, and two MOSFETs 18 and 19. The first output section 16 is connected to the first output terminal 81. The second output section 17 is connected to the first connection line 80. The MOSFETs 18 and 19 are connected in series with each other so that the parasitic diodes are oriented in opposite directions. The MOSFETs 18 and 19 are switched between an on state and an off state depending on whether the light emitting element 25 emits light. When the MOSFETs 18 and 19 are in the on state, the first output section 16 and the second output section 17 are electrically connected. When the MOSFETs 18 and 19 are in the off state, the first output section 16 and the second output section 17 are electrically disconnected.

The second output circuit 22 of the second semiconductor relay 20 includes a first output section 26, a second output section 27, and two MOSFETs 28 and 29. The first output section 26 is connected to the first connection line 80. The second output section 27 is connected to the second output terminal 82. The MOSFETs 28 and 29 are connected in series with each other so that the directions of the parasitic diodes are opposite to each other. The MOSFETs 28 and 29 are switched between an on state and an off state depending on whether the light emitting element 25 emits light. When the MOSFETs 28 and 29 are in the on state, the first output section 26 and the second output section 27 are electrically connected. When the MOSFETs 28 and 29 are in the off state, the first output section 26 and the second output section 27 are electrically disconnected.

The third output circuit 32 of the third semiconductor relay 30 includes a first output section 36, a second output section 37, and two MOSFETs 38 and 39. The first output section 36 is connected to the first connection line 80. The second output section 37 is connected to the third output terminal 83. The MOSFETs 38 and 39 are connected in series with each other so that the directions of the parasitic diodes are opposite to each other. The MOSFETs 38 and 39 are switched between an on state and an off state depending on whether the light emitting element 25 emits light. When the MOSFETs 38 and 39 are in the on state, the first output section 36 and the second output section 37 are electrically connected. When the MOSFETs 38 and 39 are in the off state, the first output section 36 and the second output section 37 are electrically disconnected.

As illustrated in FIG. 1, the first input terminal 71, the second input terminal 72, and the third input terminal 73 are connected to the power supply terminal 3 and the control terminal 4 via the control circuit 5. A power supply voltage is supplied to the power supply terminal 3. An input signal is supplied to the control terminal 4.

The control circuit 5 includes a first circuit 91, a second circuit 92, and a third circuit 93. The first circuit 91 connects the power supply terminal 3 and the first input terminal 71. The second circuit 92 connects the control terminal 4 and the second input terminal 72 via the transistor 94 and the resistor 95. The third circuit 93 connects the control terminal 4 and the third input terminal 73 via the transistors 96 and 97 and the resistor 98. The transistor 96 is connected to the power supply terminal 3 via the resistor 99. The configuration of the control circuit 5 is not limited to that illustrated in FIG. 1 and may be changed.

The first output terminal 81 is connected to the first external output terminal 6. The second output terminal 82 is connected to the second external output terminal 7. The third output terminal 83 is connected to the ground point GND. That is, the third output terminal 83 is a ground terminal for grounding the first connection line 80.

The control circuit 5 switches the energization state of each input terminal of the semiconductor relay module 2a between the first state and the second state according to the input signal supplied to the control terminal 4. The first state is a state in which current flows through the first input terminal 71 and the second input terminal 72 and no current flows through the third input terminal 73. The second state is a state in which no current flows through the first input terminal 71 and the second input terminal 72, and a current flows through the third input terminal 73.

Figure 3:
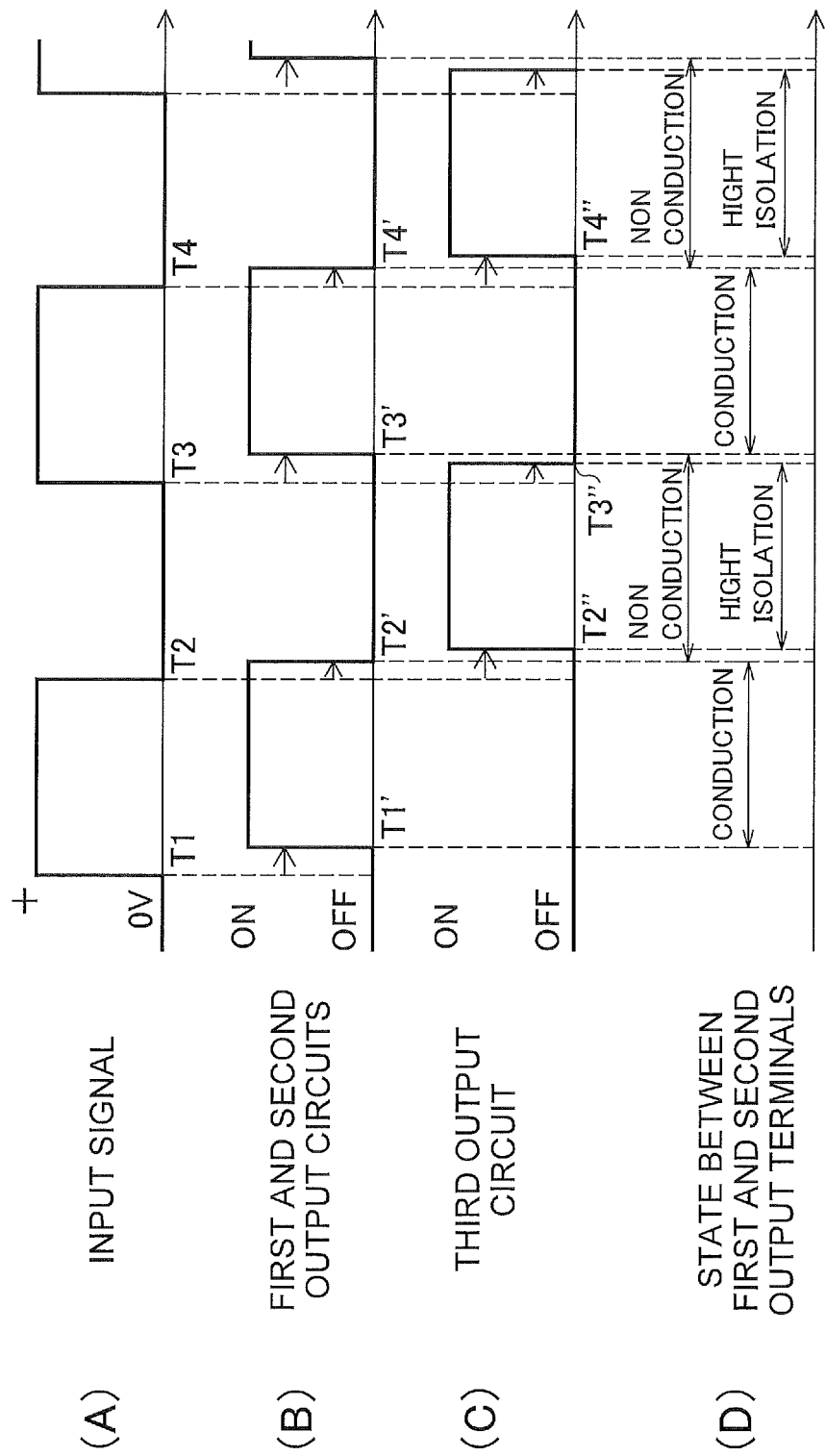
FIG. 3 is a timing chart showing an example of the operation of the semiconductor relay module.

FIG. 3 is a timing chart showing the operation of the semiconductor relay module 2a according to the voltage control of the input signal. FIG. 3A shows a change in voltage of the input signal supplied to the control terminal 4. FIG. 3B shows changes in the on/off states of the first output circuit 12 of the first semiconductor relay 10 and the second output circuit 22 of the second semiconductor relay 20. FIG. 3C shows changes in the on/off state of the third output circuit 32 of the third semiconductor relay 30. FIG. 3D shows a change in the conduction/non-conduction state between the first output terminal 81 and the second output terminal 82.

As illustrated in FIG. 3A, at time T1, when an ON (+) input signal is supplied to the control terminal 4, the control circuit 5 sets the energization state to each input terminal 71 to 73 of the semiconductor relay module 2a to the first state. That is, current flows through the first input terminal 71 and the second input terminal 72, and no current flows through the third input terminal 73. As a result, The current flowing through the first input circuit 11 and the second input circuit 21 causes the first output circuit 12 and the second output circuit 22 to be in the on state at time T1', which is slightly delayed from time T1, as shown in FIG. 3B. Further, since no current flows in the third input circuit 31, the third output circuit 32 is in the off state as illustrated in FIG. 3C. Thereby, as illustrated in FIG. 3D, the first output terminal 81 and the second output terminal 82 are electrically connected to each other at time T1'. At this time, the first connection line 80 and the third output terminal 83 are electrically disconnected to each other.

Next, as illustrated in FIG. 3A, at time T2, when the input signal to the control terminal 4 is turned off, the control circuit 5 changes the energized state to the input terminals 71 to 73 of the semiconductor relay module 2a to the second state. That is, no current flows through the first input terminal 71 and the second input terminal 72, and a current flows through the third input terminal 73. As a result, the lack of current flow to the first input circuit 11 and the second input circuit 21 causes the first output circuit 12 and the second output circuit 22 to be in the off state at time T2', which is slightly delayed from time T2, as shown in FIG. 3B. Further, as illustrated in FIG. 3C, the third output circuit 32 is in the on state at a time T2" slightly delayed from the time T2'. As a result, as illustrated in FIG. 3D, the first output terminal 81 and the second output terminal 82 are electrically disconnected to each other after the time T2'. Further, after the time T2", the first connection line 80 and the third output terminal 83 are electrically connected to each other, so that the first connection line 80 is grounded via the third output terminal 83. Thereby, good isolation characteristics can be obtained.

Similarly to the above, when an ON input signal is supplied to the control terminal 4 at time T3 as illustrated in FIG. 3A, as illustrated in FIG. 3C, at time T3" slightly delayed from time T3, the third output circuit 32 is in the off state. Further, as illustrated in FIG. 3B, the first output circuit 12 and the second output circuit 22 are in the on state at a time T3' slightly delayed from the time T3". Thereby, as illustrated in FIG. 3D, the first output terminal 81 and the second output terminal 82 are electrically connected to each other. Further, the first connection line 80 and the third output terminal 83 are electrically disconnected to each other.

Next, when the input signal to the control terminal 4 is turned off at time T4 as illustrated in FIG. 3A, as illustrated in FIG. 3B, the first output circuit 12 and the second output circuit 22 are in the off state at time T4' slightly delayed from time T4. Further, as illustrated in FIG. 3C, the third output circuit 32 is in the on state at a time T4" slightly delayed from the time T4'. As a result, as illustrated in FIG. 3D, after the time T4', the first output terminal 81 and the second output terminal 82 are electrically disconnected to each other. Further, after the time T4", the first connection line 80 and the third output terminal 83 are electrically connected to each other.

In the semiconductor relay module 2a according to the present embodiment described above, the first output circuit 12 of the first semiconductor relay 10 and the second output circuit 22 of the second semiconductor relay 20 are connected in series with each other and are configured to be switched between the on state and the off state at the same time. Further, when the first output terminal 81 and the second output terminal 82 are electrically disconnected to each other, the first connection line 80 is electrically connected to the third output terminal 83 and is thus grounded. Thereby, good isolation characteristics can be obtained between the first output terminal 81 and the second output terminal 82.

The second input circuit 21 is connected in series with the first input circuit 11. Therefore, the influence of variations in the VF characteristics of the light emitting elements 15 and 25 is suppressed, and the current (IF) flowing through the first input circuit 11 and the current (IF) flowing through the second input circuit 21 are made the same or substantially the same. As a result, variations in operating time between the first semiconductor relay 10 and the second semiconductor relay 20 are reduced. Therefore, more stable operation characteristics can be realized.

In the semiconductor relay module 2a, the input circuits 11, 21, and 31 of the semiconductor relays 10, 20, and 30 are connected to the input terminals 71, 72, and 73 inside the package 70, respectively. The output circuits 12, 22, and 32 of the semiconductor relays 10, 20, and 30 are connected to the output terminals 81, 82, and 83 inside the package 70, respectively. Therefore, the wiring can be simplified by avoiding a complicated wiring configuration in which the wirings cross each other on the circuit board. Thereby, it is possible to realize the semiconductor relay module 2a which can reduce the transmission loss of the high frequency signal and can easily design the circuit board.

The first semiconductor relay 10 and the second semiconductor relay 20 may be low on resistance type semiconductor relays, and the third semiconductor relay 30 may be a low terminal capacitance type semiconductor relay. That is, the output on resistance of the first semiconductor relay 10 and the output on resistance of the second semiconductor relay 20 may be smaller than the output on resistance of the third semiconductor relay 30, and the output terminal capacity of the third semiconductor relay 30 may be smaller than the output terminal capacity of the first semiconductor relay 10 and the output terminal capacity of the second semiconductor relay 20. Thereby, good insertion loss and isolation characteristics can be realized.

Alternatively, all of the first to third semiconductor relays 10, 20, and 30 may be low terminal capacitance type semiconductor relays having an output terminal capacitance of 12 pF or less. The output terminal capacitance of the low terminal capacitance type semiconductor relay is more preferably 0.8 pF or less, further preferably 0.2 pF or less.

Figure 4:
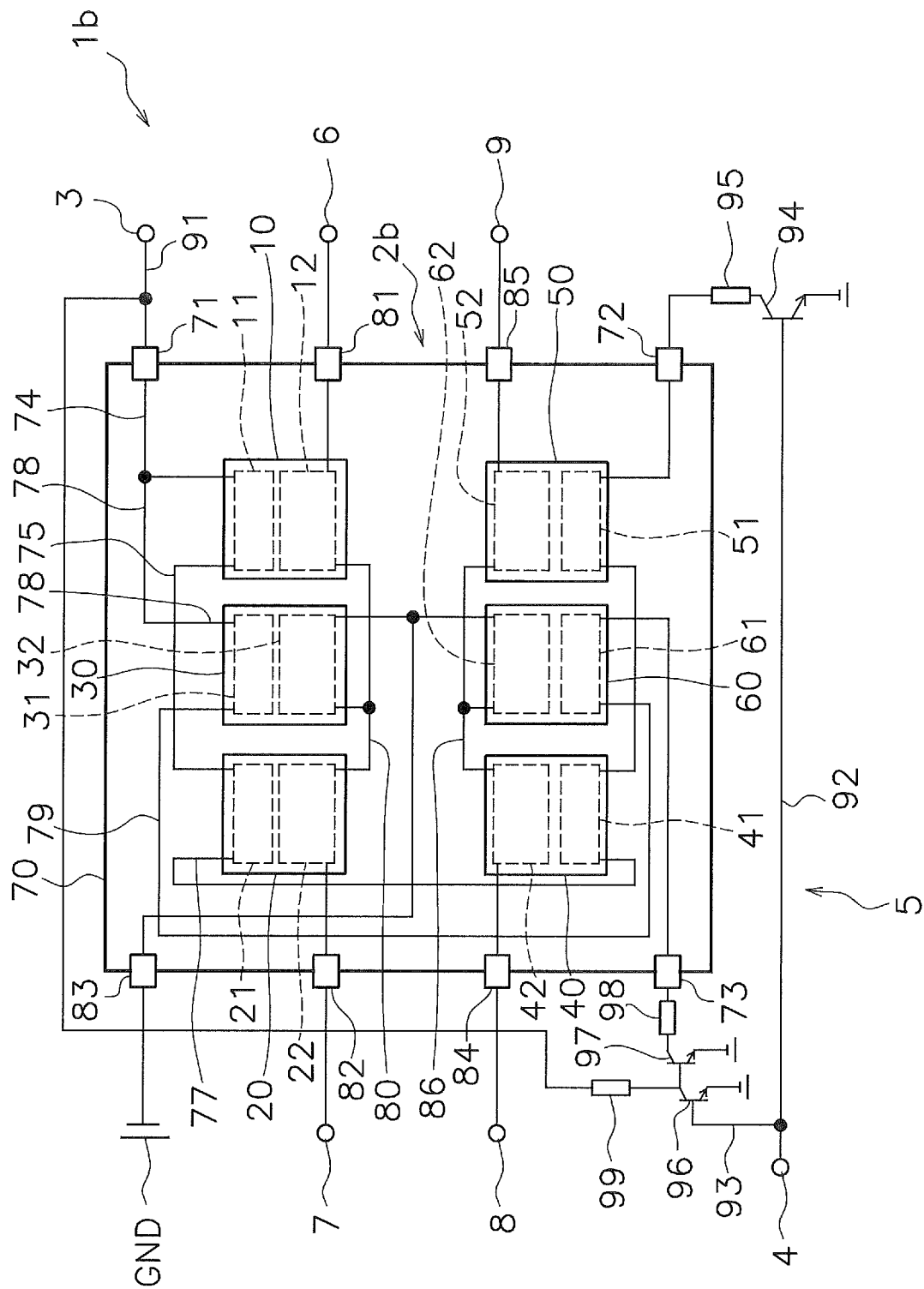
FIG. 4 is a configuration diagram showing an example of a semiconductor relay circuit according to the second embodiment.

Next, the semiconductor relay circuit 1b according to the second embodiment of the present disclosure will be described. FIG. 4 is a configuration diagram showing an example of the semiconductor relay circuit 1b according to the second embodiment. In FIG. 4, the configurations of the semiconductor relay circuit 1b according to the second embodiment that are the same components as those in the first embodiment are designated by the same reference numerals. For example, the power supply terminal 3, the control terminal 4, the control circuit 5, the first semiconductor relay 10, the second semiconductor relay 20, the third semiconductor relay 30, the package 70, the first input terminal 71, the second input terminal 72, the third input terminal 73, the first output terminal 81, the second output terminal 82, and the third output terminal 83 are the same as that of first embodiment, therefore detailed description is omitted.

The semiconductor relay circuit 1b includes a semiconductor relay module 2b. The semiconductor relay module 2b further includes, in addition to the configuration of the semiconductor relay module 2a described above, a fourth semiconductor relay 40, a fifth semiconductor relay 50, a sixth semiconductor relay 60, a fourth output terminal 84, and a fifth output terminal 85, and a second connection line 86. The fourth to sixth semiconductor relays 40, 50, and 60 are arranged in parallel with the direction in which the first to third semiconductor relays 10, 20, and 30 are arranged. The fourth to sixth semiconductor relays 40, 50, and 60 are arranged in a direction intersecting the direction in which the first to third semiconductor relays 10, 20, are 30 are arranged with respect to the first to third semiconductor relays 10, 20, and 30. However, the arrangement with the fourth to sixth semiconductor relays 40, 50, and 60 may be changed. For example, the first to sixth semiconductor relays 10, 20, 30, 40, 50, and 60 may be arranged in a line in the longitudinal direction of the package 70.

The fourth semiconductor relay 40 includes a fourth input circuit 41 and a fourth output circuit 42. When current is flowing in the fourth input circuit 41, the fourth output circuit 42 is in the on state. When no current flows in the fourth input circuit 41, the fourth output circuit 42 is in the off state. The fifth semiconductor relay 50 includes a fifth input circuit 51 and a fifth output circuit 52. When current is flowing through the fifth input circuit 51, the fifth output circuit 52 is in the on state. When no current flows in the fifth input circuit 51, the fifth output circuit 52 is in the off state. The sixth semiconductor relay 60 includes a sixth input circuit 61 and a sixth output circuit 62. When current is flowing in the sixth input circuit 61, the sixth output circuit 62 is in the on state. When no current flows in the sixth input circuit 61, the sixth output circuit 62 is in the off state.

The fourth output terminal 84 and the fifth output terminal 85 are arranged in the package 70, and are arranged so that a part of the fourth output terminal 84 and a part of the fifth output terminal 85 are exposed to the outside of the package 70. The second connection line 86 connects the fourth output circuit 42 and the fifth output circuit 52 inside the package 70. The fourth output terminal 84 is connected to the third external output terminal 8. The fifth output terminal 85 is connected to the fourth external output terminal 9.

The fourth input circuit 41 and the fifth input circuit 51 are connected to the first input terminal 71 and the second input terminal 72 inside the package 70. The fifth input circuit 51 is connected in series with the fourth input circuit 41 inside the package 70. The first input circuit 11, the second input circuit 21, the fourth input circuit 41, and the fifth input circuit 51 are connected to each other in series inside the package 70. The fourth input circuit 41 is connected to the second input circuit 21 inside the package 70. The fifth input circuit 51 is connected to the second input terminal 72 inside the package 70. The sixth input circuit 61 is connected to the third input terminal 73 inside the package 70. The sixth input circuit 61 is connected in series with the third input circuit 31 inside the package 70.

The fourth output circuit 42 is connected to the fourth output terminal 84 and the second connection line 86 inside the package 70. The fifth output circuit 52 is connected to the fifth output terminal 85 and the second connection line 86 inside the package 70. The sixth output circuit 62 is connected to the third output terminal 83 and the second connection line 86 inside the package 70.

Figure 5:
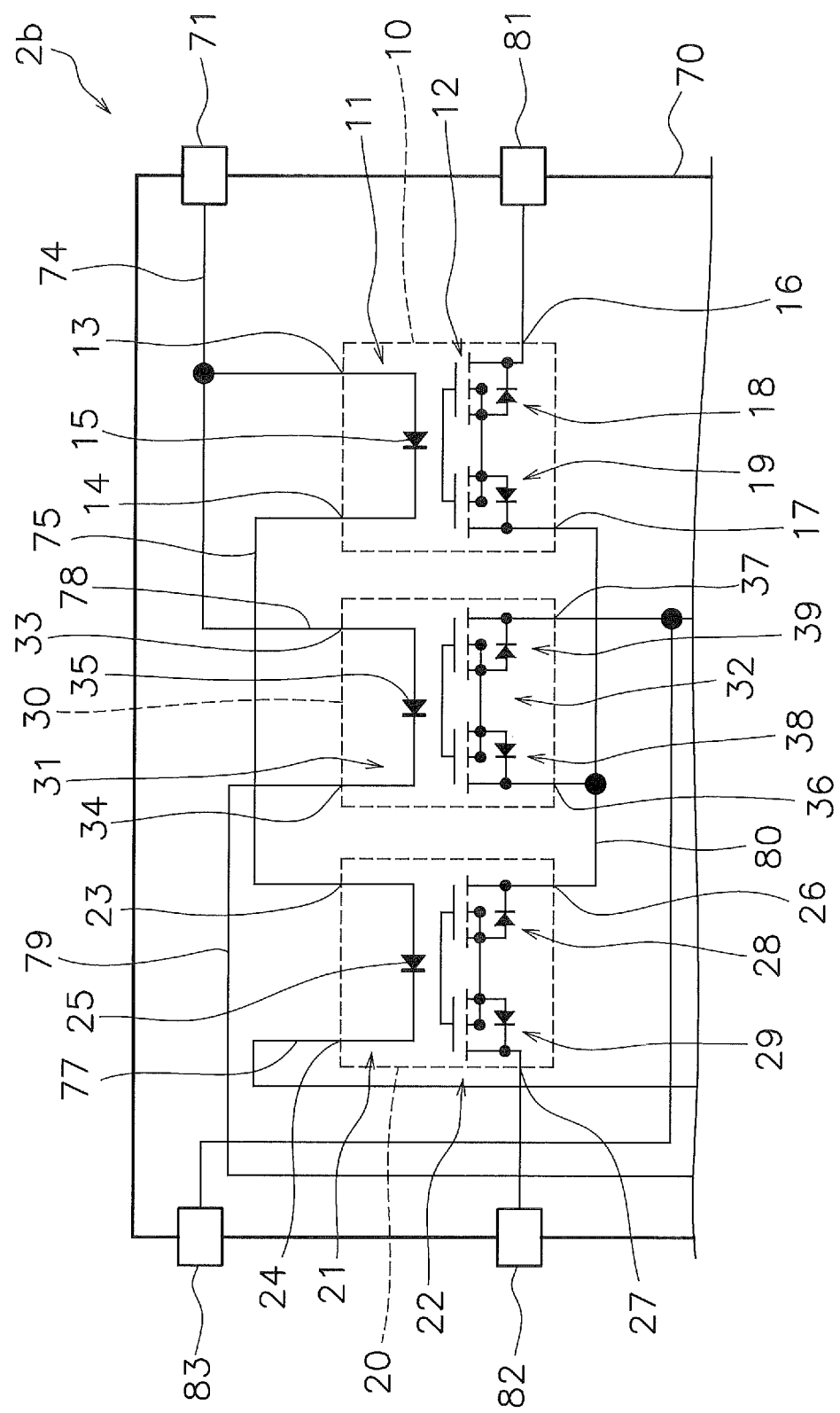
FIG. 5 is a configuration diagram showing an example of a semiconductor relay module according to the second embodiment.
Figure 6:
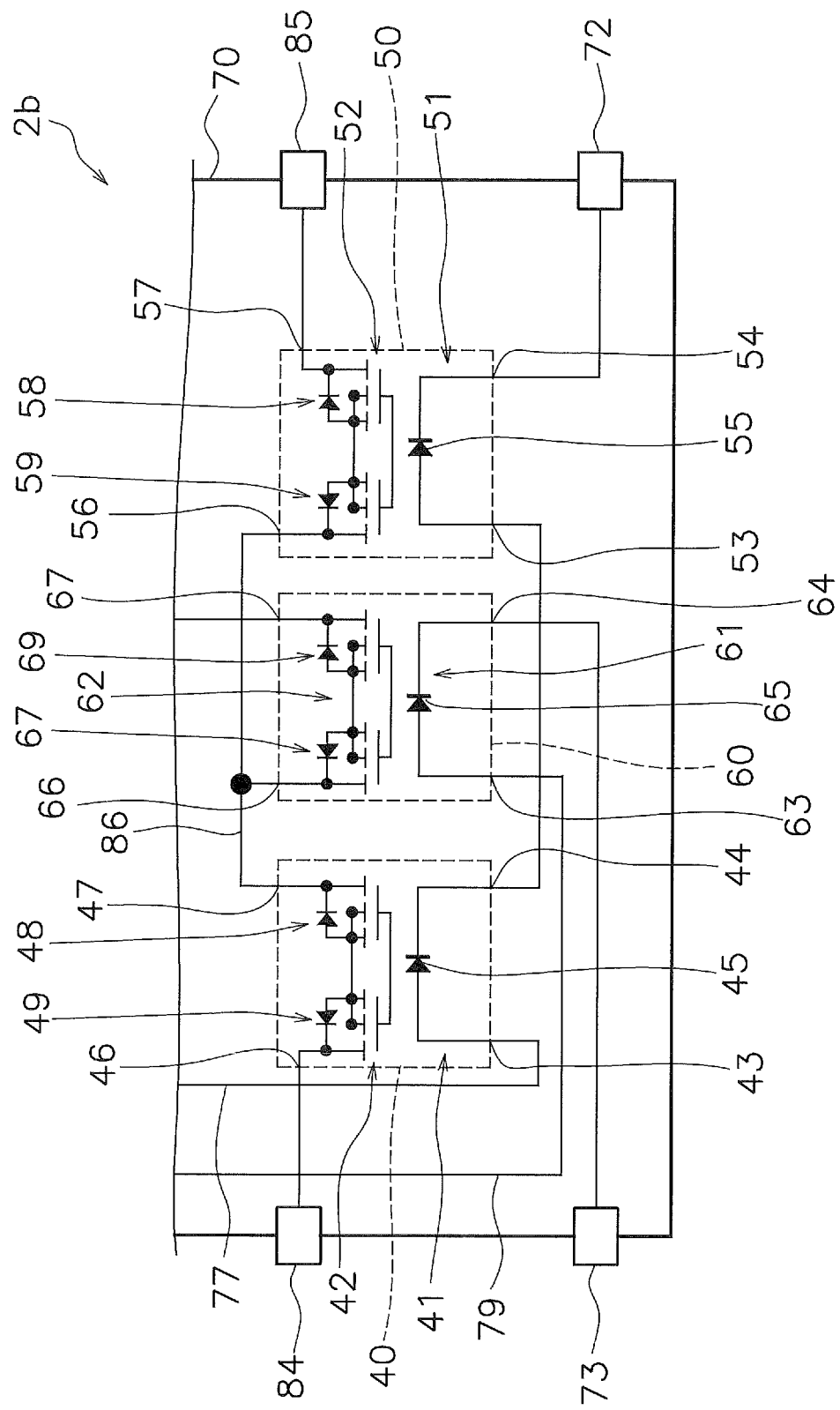
FIG. 6 is a configuration diagram showing an example of the semiconductor relay module according to the second embodiment.

FIGS. 5 and 6 are diagrams showing an example of the configuration of the semiconductor relay module 2b. As illustrated in FIG. 6, the fourth input circuit 41 of the fourth semiconductor relay 40 includes a first input section 43, a second input section 44, and a light emitting element 45. The first input section 43 is connected to the second input section 24 of the second input circuit 21. The fifth input circuit 51 of the fifth semiconductor relay 50 includes a first input section 53, a second input section 54, and a light emitting element 55. The first input section 53 is connected to the second input section 44 of the fourth input circuit 41. The second input section 54 is connected to the second input terminal 72. The sixth input circuit 61 of the sixth semiconductor relay 60 includes a first input section 63, a second input section 64, and a light emitting element 65. The first input section 63 is connected to the second input section 34 of the third input circuit 31. The second input section 64 is connected to the third input terminal 73. The configuration of the light emitting elements 45, 55, and 65 of the fourth to sixth semiconductor relays 40, 50, and 60 is similar to that of the light emitting elements 15, 25, and 35 of the first to third semiconductor relays 10, 20, and 30 described above. Therefore, detailed description is omitted.

The fourth output circuit 42 of the fourth semiconductor relay 40 includes a first output section 46, a second output section 47, and two MOSFETs 48 and 49. The first output section 46 is connected to the fourth output terminal 84. The second output section 47 is connected to the second connection line 86. The fifth output circuit 52 of the fifth semiconductor relay 50 includes a first output section 56, a second output section 57, and two MOSFETs 58 and 59. The first output section 56 is connected to the second connection line 86. The second output section 57 is connected to the fifth output terminal 85. The sixth output circuit 62 of the sixth semiconductor relay 60 includes a first output section 66, a second output section 67, and two MOSFETs 68 and 69. The first output section 66 is connected to the second connection line 86. The second output section 67 is connected to the third output terminal 83. The configurations of the MOSFETs 48, 49, 58, 59, 68, and 69 of the fourth to sixth semiconductor relays are similar to those of the MOSFETs 18, 19, 28, 29, 38, and 39 of the first to third semiconductor relays. Therefore detailed description is omitted.

In the semiconductor relay module 2b, in the first state in which the current flows through the first input terminal 71 and the second input terminal 72 and the current does not flow through the third input terminal 73, the first output circuit 12, the second output circuit 22, the fourth output circuit 42, and the fifth output circuit 52 are in the on state, and the third output circuit 32 and the sixth output circuit 62 are in the off state. As a result, the first output terminal 81 and the second output terminal 82 are electrically connected to each other, the fourth output terminal 84 and the fifth output terminal 85 are electrically connected to each other, the first connection line 80 and the third output terminal 83 are electrically disconnected to each other, and the second connection line 86 and the third output terminal 83 are electrically disconnected to each other.

In the second state in which no current flows through the first input terminal 71 and the second input terminal 72 and a current flows through the third input terminal 73, the first output circuit 12, the second output circuit 22, the fourth output circuit 42, and the fifth output circuit 52 is in the off state, and the third output circuit 32 and the sixth output circuit 62 are in the on state. As a result, the first output terminal 81 and the second output terminal 82 are electrically disconnected to each other, the fourth output terminal 84 and the fifth output terminal 85 are electrically disconnected to each other, the first connection line 80 and the third output terminal 83 are electrically connected to each other, and the second connection line 86 and the third output terminal 83 are electrically connected to each other.

The semiconductor relay module 2b according to the second embodiment described above is controlled by voltage control of the input signal supplied to the control terminal 4, similarly to the semiconductor relay module 2a according to the first embodiment. In that case, the fourth output circuit 42 and the fifth output circuit 52 are switched between the on state and the off state, similarly to the first output circuit 12 and the second output circuit 22 illustrated in FIG. 3B. Further, the sixth output circuit 62 can be switched between the on state and the off state, similarly to the third output circuit 32 illustrated in FIG. 3C. As a result, the fourth output terminal 84 and the fifth output terminal 85 are switched between the conduction state and the non-conduction state, like the first output terminal 81 and the second output terminal 82 illustrated in FIG. 3D.

In the semiconductor relay module 2b, the first output circuit 12 of the first semiconductor relay 10 and the second output circuit 22 of the second semiconductor relay 20 are connected in series with each other, and the fourth output circuit 42 of the fourth semiconductor relay 40 and the fifth output circuit 52 of the fifth semiconductor relay 50 are connected in series with each other. These output circuits are simultaneously switched to the on state and the off state.

The third semiconductor relay 30 controls the connection of the first connection line 80 connecting the first output circuit 12 and the second output circuit 22 to the ground point GND. The sixth semiconductor relay 60 controls the connection of the second connection line 86 connecting the fourth output circuit 42 and the fifth output circuit 52 to the ground point GND. Thereby, isolation characteristics can be improved between the first output terminal 81 and the second output terminal 82 and between the fourth output terminal 84 and the fifth output terminal 85.

Further, similarly to the semiconductor relay module 2a according to the first embodiment, also in the semiconductor relay module 2b according to the second embodiment, by avoiding a complicated wiring configuration in which wirings cross each other on a circuit board, wiring can be simplified. Thereby, it is possible to realize the semiconductor relay module 2b which can reduce the transmission loss of the high frequency signal and can easily design the circuit board.

Although one embodiment of the present invention has been described above, the present invention is not limited to the above embodiment, and various modifications can be made without departing from the scope of the invention.

The structures of the semiconductor relay circuit, the semiconductor relay module, and the semiconductor relay are not limited to those in the above-described embodiment, and may be changed. The number of semiconductor relays included in the semiconductor relay module is not limited to three or six. The number of semiconductor relays may be four or more, or seven or more.

The third input circuit 31 may be connected to the second input terminal 72 and the third input terminal 73 inside the package 70. The sixth input circuit 61 may be connected to the second input terminal 72 and the third input terminal 73 inside the package 70.

Figure 7:
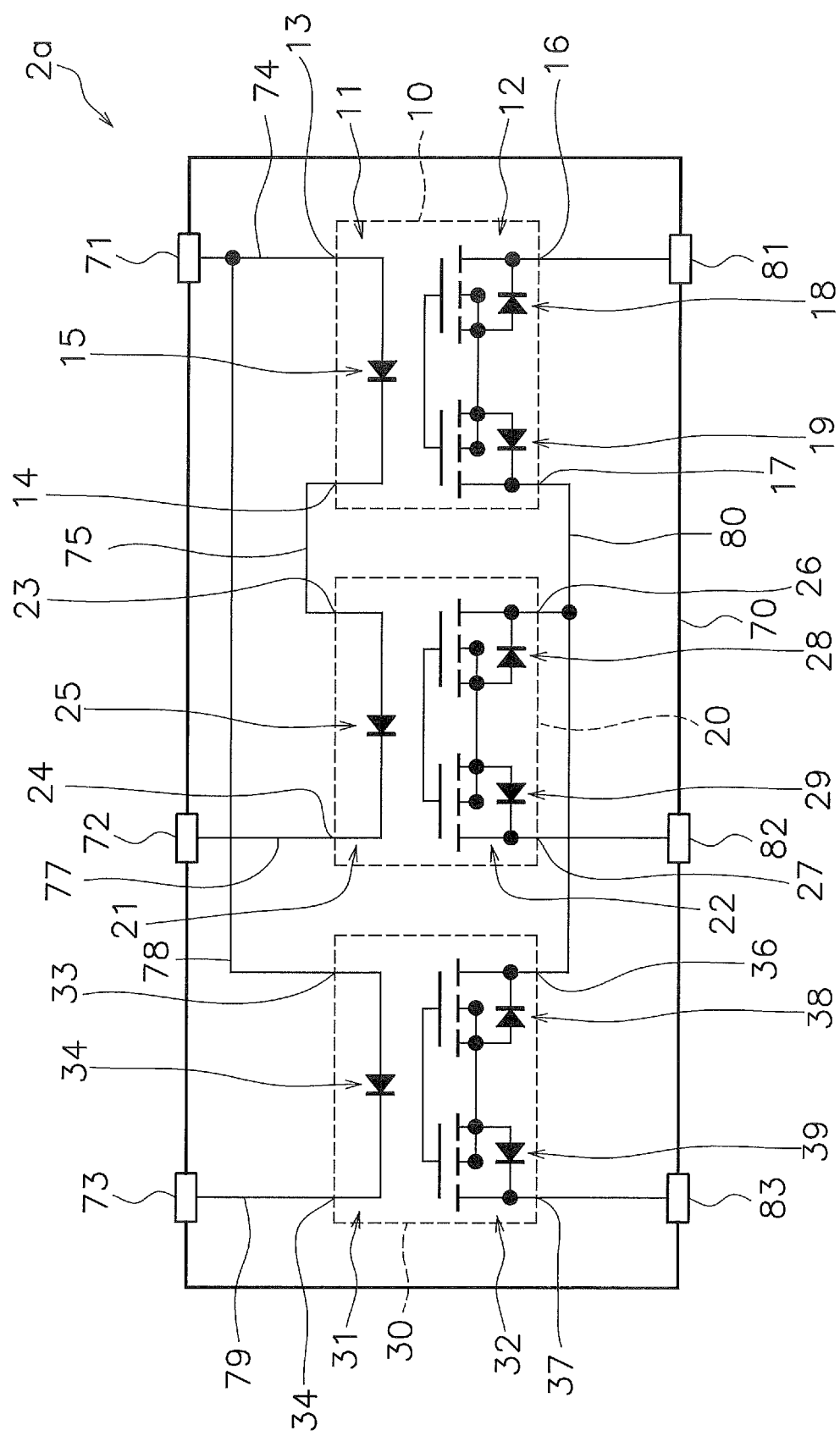
FIG. 7 is a configuration diagram showing another example of the semiconductor relay module.

The arrangement of the first to third semiconductor relays 10, 20, and 30 in the semiconductor relay module 2a according to the first embodiment is not limited to that of the above-described embodiment, and may be changed. For example, as illustrated in FIG. 7, the second semiconductor relay 20 may be arranged between the first semiconductor relay 10 and the third semiconductor relay 30. Similarly, in the semiconductor relay module 2b according to the second embodiment, the arrangement of the first to sixth semiconductor relays 10, 20, 30, 40, 50, and 60 is not limited to that of the above-described embodiment, and may be changed. The arrangement of the input terminals and/or the output terminals is not limited to that of the above-described embodiment, and may be changed.

The configuration of the control circuit 5 is not limited to that of the above embodiment and may be changed. For example, the control circuit 5 may be configured to switch the energization state of each input terminal of the semiconductor relay module 2a between the first state and the second state by controlling the current of the input signal to the second input terminal 72 and the third input terminal 73.

Figure 8:
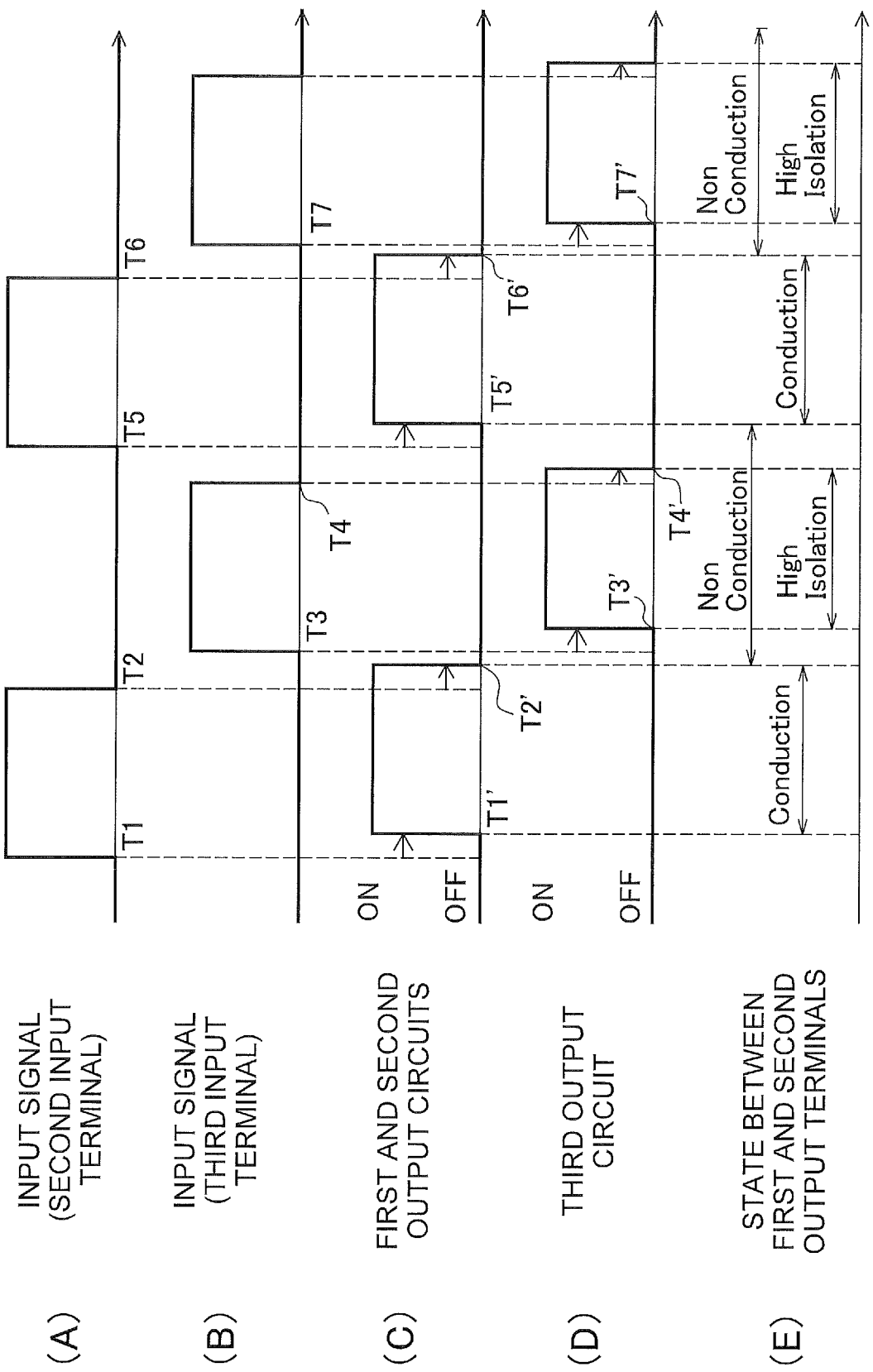
FIG. 8 is a timing chart showing another example of the operation of the semiconductor relay module.

FIG. 8 is a timing chart showing the operation of the semiconductor relay module 2a according to the current control of the input signal. FIG. 8A shows a change in current of the input signal supplied to the second input terminal 72. FIG. 8B shows a change in current of the input signal supplied to the third input terminal 73. FIG. 8C shows changes in the on/off states of the first output circuit 12 of the first semiconductor relay 10 and the second output circuit 22 of the second semiconductor relay 20. FIG. 8C shows changes in the on/off state of the third output circuit 32 of the third semiconductor relay 30. FIG. 8E shows a change in the conduction/non-conduction state between the first output terminal 81 and the second output terminal 82.

As illustrated in FIGS. 8A and 8B, at time T1, when the ON input signal is supplied to the second input terminal 72 and the input signal to the third input terminal 73 is turned off, the energized state of each input terminal of the semiconductor relay module 2a is the first state. That is, current flows through the first input terminal 71 and the second input terminal 72, and no current flows through the third input terminal 73. As a result, the current flowing through the first input circuit 11 and the second input circuit 21 causes the first output circuit 12 and the second output circuit 22 to be in the on state at time T1', which is slightly delayed from time T1, as shown in FIG. 8C. Further, since no current flows in the third input circuit 31, the third output circuit 32 is in the off state as illustrated in FIG. 8D. As a result, as illustrated in FIG. 8E, the first output terminal 81 and the second output terminal 82 are electrically connected to each other at time T1'. At this time, the first connection line 80 and the third output terminal 83 are electrically disconnected to each other.

Next, at time T2 as illustrated in FIG. 8A, when the input signal to the second input terminal 72 is turned off, and at time T3 as illustrated in FIG. 8B, the ON input signal is supplied to the third input terminal 73, the energization state of each input terminal of the semiconductor relay module 2a becomes the second state. That is, no current flows through the first input terminal 71 and the second input terminal 72, and a current flows through the third input terminal 73. As a result, the lack of current flow to the first input circuit 11 and the second input circuit 21 causes the first output circuit 12 and the second output circuit 22 to be in the off state at time T2', which is slightly delayed from time T2, as shown in FIG. 8C. Further, as illustrated in FIG. 8D, the third output circuit 32 is in the on state at a time T3' slightly delayed from the time T3. As a result, as illustrated in FIG. 8E, the first output terminal 81 and the second output terminal 82 are electrically disconnected to each other after the time T2'. In addition, after the time T3', the first connection line 80 and the third output terminal 83 are electrically connected to each other. Therefore, as illustrated in FIG. 8E, the first connection line 80 is grounded via the third output terminal 83 when the first output terminal 81 and the second output terminal 82 are electrically disconnected to each other.

Thereafter, similarly to the above, when the input signal to the third input terminal 73 is turned off at time T4 as illustrated in FIG. 8B, the third output circuit 32 is in the off state at time T4' slightly delayed from time T4 as illustrated in FIG. 8D. Further, as illustrated in FIG. 8A, when the ON input signal is supplied to the second input terminal 72 at time T5, as illustrated in FIG. 8C, the first output circuit 12 and the second output circuit 22 are in the on state at time T5' slightly delayed from time T5. As a result, after the time T4', the first connection line 80 and the third output terminal 83 are electrically disconnected to each other. Further, as illustrated in FIG. 8E, after the time T5', the first output terminal 81 and the second output terminal 82 are electrically connected to each other.

Next, at time T6 as illustrated in FIG. 8A, when the input signal to the second input terminal 72 is turned off, as illustrated in FIG. 8C, the first output circuit 12 and the second output circuit 22 are in the off state at time T6' slightly delayed from time T6. Further, when an ON input signal is supplied to the third input terminal 73 at time T7 as illustrated in FIG. 8B, the third output circuit 32 is in the on state at time T7' slightly delayed from time T7 as illustrated in FIG. 8D. As a result, as illustrated in FIG. 8E, the first output terminal 81 and the second output terminal 82 are electrically disconnected to each other after the time T6'. Further, after the time T7', the first connection line 80 and the third output terminal 83 are electrically connected to each other.

The semiconductor relay module 2b according to the second embodiment may also be controlled in the same manner as above by controlling the current of the input signal to the second input terminal 72 and the third input terminal 73.

In the second embodiment, the fourth input circuit 41 and the fifth input circuit 51 may be connected in parallel to the first input circuit 11 and the second input circuit 21. The sixth input circuit 61 may be connected in parallel to the third input circuit 31.

REFERENCE NUMERALS

3: Power supply terminal, 4: Control terminal, 5: Control circuit, 11: First input circuit, 12: First output circuit, 10:

First semiconductor relay, 20: Second semiconductor relay, 21: Second input circuit, 22: Second output circuit, 30: Third semiconductor relay, 31: Third input circuit, 32: Third output circuit, 40: Fourth semiconductor relay, 41: Fourth input circuit, 42: Fourth output circuit, 50: Fifth semiconductor relay, 51: Fifth input circuit, 52: Fifth output circuit, 61: Sixth input circuit, 62: Sixth output circuit, 60: Sixth semiconductor relay, 70: Package, 71: First input terminal, 72: Second input terminal, 73 Third input terminal, 80: First connection line, 81: First output terminal, 82: Second output terminal, 83: Third output terminal, 84: Fourth output terminal, 85: Fifth output terminal, 86: Second connection line

The invention claimed is:

1. A semiconductor relay module comprising:
a first semiconductor relay including a first input circuit and a first output circuit;
a second semiconductor relay including a second input circuit and a second output circuit;
a third semiconductor relay including a third input circuit and a third output circuit;
a package configured to house the first semiconductor relay, the second semiconductor relay, and the third semiconductor relay in the package;
a first input terminal disposed in the package, a part of the first input terminal being exposed outside of the package;
a second input terminal disposed in the package, a part of the second input terminal being exposed outside of the package;
a third input terminal disposed in the package, a part of the third input terminal being exposed outside of the package;
a first output terminal disposed in the package, a part of the first output terminal being exposed outside of the package;
a second output terminal disposed in the package, a part of the second output terminal being exposed outside of the package;
a third output terminal disposed in the package, a part of the third output terminal being exposed outside of the package, and
a first connection line connecting the first output circuit and the second output circuit in the package,
the first input circuit and the second input circuit being connected to the first input terminal and the second input terminal in the package,
the second input circuit being connected in series with the first input circuit in the package,
the third input circuit being connected to the first input terminal or the second input terminal in the package,
the third input circuit being connected to the third input terminal in the package,
the first output circuit being connected to the first output terminal and the first connection line in the package,
the second output circuit being connected to the second output terminal and the first connection line in the package,
the third output circuit being connected to the third output terminal and the first connection line in the package,
in a first state in which a current flows through the first input terminal and the second input terminal without flowing through the third input terminal, the first output circuit and the second output circuit being configured to be turned on, the third output circuit being configured to be turned off, the first output terminal and the second output terminal being configured to be electrically connected to each other, and the first connection line and the third output terminal being configured to be electrically disconnected to each other, and
in a second state in which a current flows through the third input terminal without flowing through the first input terminal and the second input terminal, the first output circuit and the second output circuit being configured to be turned off, the third output circuit being configured to be turned on, the first output terminal and the second output terminal being configured to be electrically disconnected to each other, and the first connection line and the third output terminal being configured to be electrically connected to each other.

2. A semiconductor relay circuit comprising:
the semiconductor relay module according to claim 1;
a power supply terminal connected to the first input terminal;
a control terminal; and
a control circuit connected to the control terminal, the first input terminal, the second input terminal, and the third input terminal, the control circuit being configured to switch between the first state and the second state according to an input signal supplied to the control terminal.

3. The semiconductor relay module according to claim 1, further comprising:
a fourth semiconductor relay including a fourth input circuit and a fourth output circuit;
a fifth semiconductor relay including a fifth input circuit and a fifth output circuit;
a sixth semiconductor relay including a sixth input circuit and a sixth output circuit;
a fourth output terminal disposed in the package, a part of the fourth output terminal being exposed outside of the package;
a fifth output terminal disposed in the package, a part of the fifth output terminal being exposed outside of the package; and
a second connection line connecting the fourth output circuit and the fifth output circuit in the package, wherein
the fourth input circuit and the fifth input circuit are connected to the first input terminal and the second input terminal in the package,
the fifth input circuit is connected in series with the fourth input circuit in the package,
the sixth input circuit is connected to the first input terminal or the second input terminal in the package,
the sixth input circuit is connected to the third input terminal in the package,
the fourth output circuit is connected to the fourth output terminal and the second connection line in the package,
the fifth output circuit is connected to the fifth output terminal and the second connection line in the package, and
the sixth output circuit is connected to the third output terminal and the second connection line in the package.

4. The semiconductor relay module according to claim 3, wherein
the first input circuit, the second input circuit, the fourth input circuit, and the fifth input circuit are connected to each other in series in the package.

5. The semiconductor relay module according to claim 3, wherein
the third input circuit and the sixth input circuit are connected to each other in series in the package.

6. The semiconductor relay module according to claim 3, wherein in the first state, the first output circuit, the second output circuit, the fourth output circuit, and the fifth output circuit are configured to be turned on, and the third output circuit and the sixth output circuit are configured to be turned off, the first output terminal and the second output terminal are configured to be electrically connected to each other, the fourth output terminal and the fifth output terminal are configured to be electrically connected to each other, the first connection line and the third output terminal are configured to be disconnected to each other, and the second connection line and the third output terminal are configured to be disconnected to each other, and in the second state, the first output circuit, the second output circuit, the fourth output circuit, and the fifth output circuit are configured to be turned off, the third output circuit and the sixth output circuit are configured to be turned on, the first output terminal and the second output terminal are configured to be disconnected to each other, the fourth output terminal and the fifth output terminal are configured to be disconnected to each other, the first connection line and the third output terminal are configured to be connected to each other, and the second connection line and the third output terminal are configured to be connected to each other.

7. A semiconductor relay circuit comprising:

the semiconductor relay module according to claim 6;

a power supply terminal connected to the first input terminal;

a control terminal;

a control circuit connected to the control terminal, the first input terminal, the second input terminal, and the third input terminal, the control circuit being configured to switch between the first state and the second state according to an input signal supplied to the control terminal.

* * * * *